United States Patent [19]
Manson

[11] 3,878,467
[45] Apr. 15, 1975

[54] TUNING SYSTEM FOR AM/FM RECEIVERS

[75] Inventor: Peter St. C. Manson, Barrington, Ill.

[73] Assignee: Motorola, Inc., Chicago, Ill.

[22] Filed: June 6, 1973

[21] Appl. No.: 367,610

[52] U.S. Cl. .................. 325/316; 325/423; 325/453
[51] Int. Cl. .............................................. H04b 1/06
[58] Field of Search ........... 325/316, 317, 422, 423, 325/452, 453, 464, 468, 487, 320, 346, 349; 321/2, 16, 18; 331/183; 334/15; 329/126, 168, 178, 179, 106; 307/234, 273

[56] References Cited

UNITED STATES PATENTS

| | | | |
|---|---|---|---|
| 2,907,876 | 10/1959 | Smith-Vaniz, Jr. | 325/468 |
| 3,568,007 | 3/1971 | Miner | 329/126 |
| 3,581,221 | 5/1971 | Martin, Jr. | 330/24 |
| 3,657,654 | 4/1972 | Friberg | 325/452 |
| 3,727,139 | 4/1973 | Gallant et al. | 325/453 |
| 3,743,943 | 7/1973 | Mason et al. | 325/453 |

*Primary Examiner*—Howard W. Britton
*Assistant Examiner*—Jin F. Ng
*Attorney, Agent, or Firm*—Vincent J. Rauner; Donald J. Lisa

[57] ABSTRACT

An AM and FM receiver wherein the local oscillator of the AM receiver is tuned by manual means, such as pushbuttons, and the variable frequency AC signal is taken from the local oscillator, converted to a DC signal by a discriminator and utilized to tune variable capacitance diodes in the front end of the FM receiver. The DC signal may also be utilized to control variable capacitance diodes in the front end of the AM receiver.

4 Claims, 2 Drawing Figures

TUNING SYSTEM FOR AM/FM RECEIVERS

BACKGROUND OF THE INVENTION

1. Field of the Invention

The present invention pertains to tuning systems for AM/FM radios. In the past the entire tuning system was operated manually by mechanically turning a variable capacitor or adjusting coils and/or cores of the coils to obtain the desired resonant frequency. These mechanical methods of tuning required extremely complicated mechanical devices and relatively large amounts of space for the apparatus.

In more recent years methods and apparatus for electrically tuning the front ends of radio receivers have been developed utilizing variable capacitance diodes. However, it is still desirable to have pushbutton and other automatic types of tuning for the receiver front end, which tuning is relatively difficult to combine with electrical tuning utilizing variable capacitance diodes.

2. Description of the Prior Art

In one prior art device, disclosed in U.S. Pat. No. 3,727,139, issued to Gallant on Apr. 10, 1973 and entitled "Voltage Supply for Voltage Variable Capacitor Diode Tuning," a special variable inductor voltage divider receives an AC signal from an oscillator, which may be the local oscillator. The variable inductor is manually tunable with the front end of the AM receiver and provides an output signal which has an amplitude proportional to the magnitude of inductance. The output signal is rectified and filtered to produce a DC voltage that is used to tune voltage variable capacitor diodes in the front end of the FM receiver. This circuit requires special coils for the fixed and variable inductor portions of the voltage divider, which coils can be expensive and difficult to incorporate into present radio designs.

SUMMARY OF THE INVENTION

The present invention pertains to an improved tuning system including a manually tunable local oscillator having frequency detector means coupled thereto for receiving the variable frequency AC signal from the oscillator and converting it to a DC signal varying in amplitude in response to variations in the frequency, variable capacitance means in the front end of the receiver for tuning the front end and responsive to the DC signal from the frequency detector means for varying the tuning of the receiver front end in response to manual tuning of said local oscillator means.

It is an object of the present invention to provide an improved tuning system utilizing voltage variable capacitance means.

It is a further object of the present invention to provide means for receiving the variable frequency signal from the local oscillator of a receiver and converting said AC signal to a DC signal which is then utilized to control the capacitance of voltage variable capacitance diodes in the front end of the receiver.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
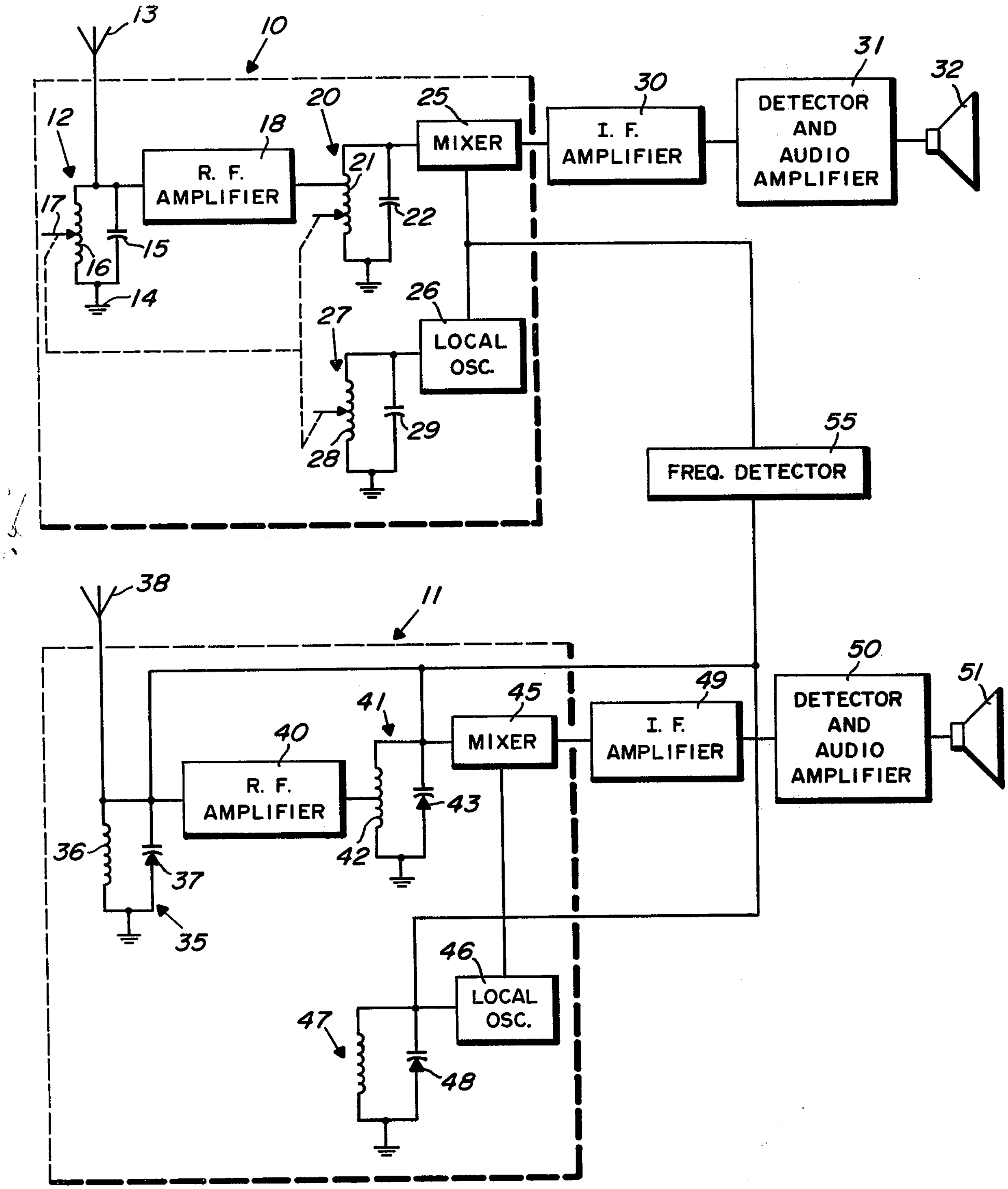
FIG. 1 is a block diagram of an AM/FM receiver incorporating the improved tuning system.

Referring specifically to FIG. 1, an AM/FM receiver is illustrated including an AM front end generally designated 10 and an FM front end generally designated 11. The AM front end 10 includes a parallel tuned antenna circuit 12 connected between an antenna 13 and ground 14 in the usual manner. The tuned circuit 12 includes a capacitor 15 and variable inductance 16, which inductance 16 is tuned by adjusting the position of a core 17 relative thereto. It should be understood that the inductance 16 could be fixed and the capacitor 15 tuned in the well known manner, if desired. The tuned circuit 12 may form a portion of an RF amplifier 18 or the RF amplifier 18 may be tunable over a predetermined range by use of a similar type of tuned circuit, all of which is well within the ability of those skilled in the art.

A second tuned circuit 20, including a variable inductance 21 and fixed capacitor 22, forms a portion of and supplies an input to a mixer stage 25. A local oscillator 26, including a tuned circuit 27 formed of a tuned inductor 28 and fixed capacitor 29, also supplies a signal to the mixer 25 which is heterodyned with the signal from the tuned circuit 20 in the usual manner to provide an IF signal. The IF signal is amplified in a circuit 30 and applied to a detector and audio amplifier circuit 31 which supply audio signals to a speaker 32. In this embodiment the variable inductances of the tuned circuits 12, 20 and 27 are varied by adjusting the position of a core relative thereto through a manually operated mechanism, which may include pushbuttons, automatic tuning, etc.

In the FM front end 11 a tuned circuit 35, including a fixed inductor 36 and a voltage variable capacitance device, such as a voltage variable capacitance diode 37, is connected between ground 14 and an antenna 38. The tuned circuit 35 may form a portion of an RF circuit 40, or the RF circuit 40 may contain additional tuned circuits similar to the circuit 35, if desired. The output of the RF circuit 40 is applied to a tuned circuit 41, including a fixed inductor 42 and a second voltage variable capacitance device such as voltage variable capacitance diode 43, which may form a portion of a mixer circuit 45. The mixer circuit 45 receives a second signal from a local oscillator 46 which has a tuned circuit 47, including a voltage variable capacitance diode 48, forming a part thereof. The signal from the mixer 45 is supplied through an IF amplifier circuit 49 to a detector and audio amplifier circuit 50, which in turn supplies audio signals to a speaker 51.

A frequency detector 55 is coupled to the local oscillator 26 of the AM front end to receive variable frequency AC signals therefrom. The frequency detector is defined to mean any suitable circuit which converts an AC signal into a DC signal with the amplitude of the DC signal being dependent upon the frequency of the AC signal. Hence, the detector is a frequency to DC converter. The detector 55 converts the AC signals to a DC signal and supplies the DC signals to at least one side of each of the voltage variable capacitance diodes 37, 43 and 48. It should of course be understood that more or less tuned circuits may be controlled by the output DC signal from the detector 55 and, in addition to the FM front end 11, portions of the AM front end 10 may also be tuned by voltage variable capacitance means, such as voltage variable capacitance diodes or the like.

Figure 2:
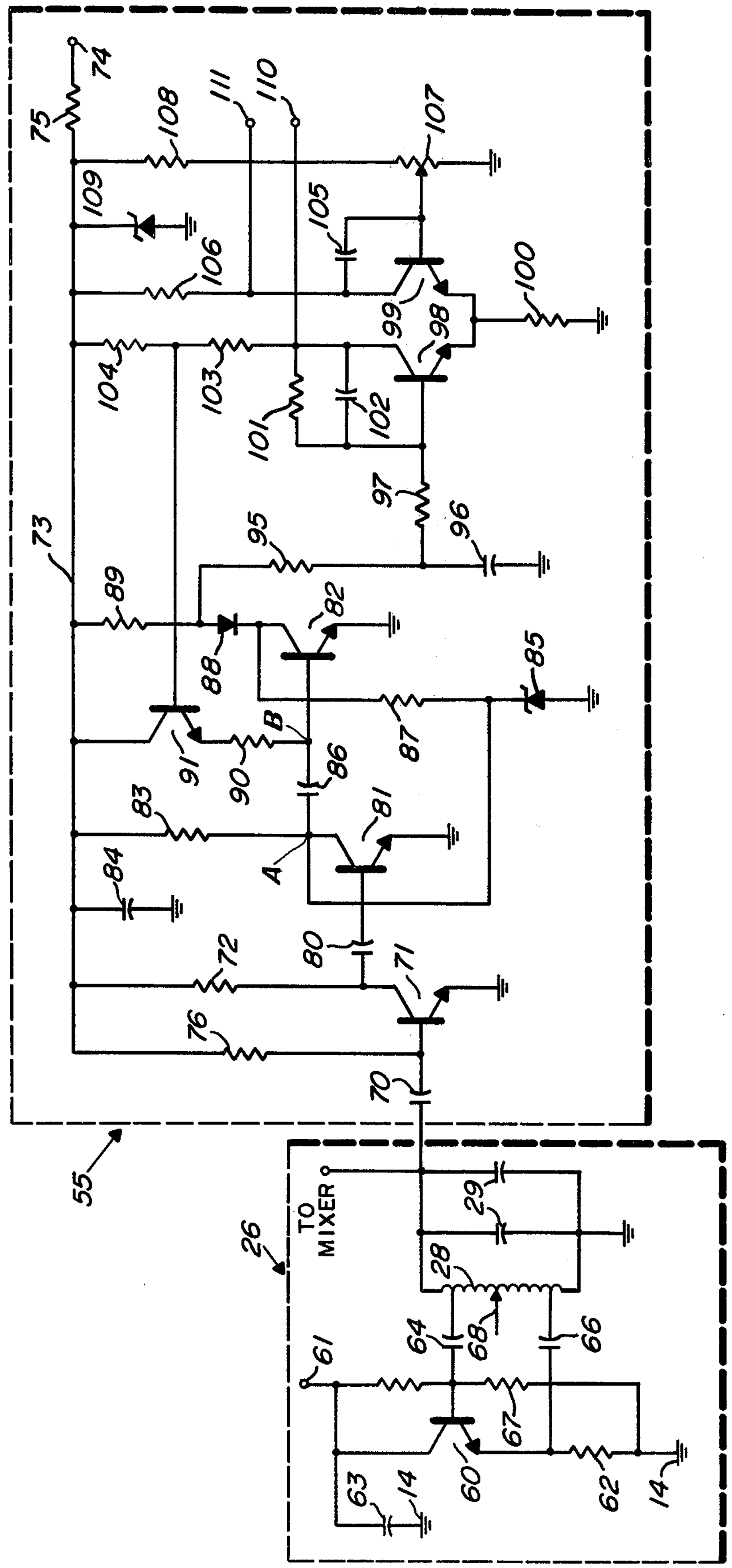
FIG. 2 is a schematic diagram of a portion of the circuitry illustrated in block form in FIG. 1.

Referring to FIG. 2, the local oscillator 26 and detector 55 are illustrated in schematic form. In the local oscillator 26 the collector of a transistor 60 is connected directly to a terminal 61 having a suitable source of voltage applied thereto and the emitter is connected through a resistor 62 to ground 14. A capacitor 63 is connected from the collector of the transistor 60 to ground 14. The base of the transistor 60 is connected through a capacitor 64 to a tap of a variable inductor 28 and a second tap of the inductor is connected through a second capacitor 66 to the emitter of the transistor 60. The base is also connected through a resistor 67 to ground 14. The inductor 28 is tunable by adjusting the position of a core 68 relative thereto in some mechanical means as described previously. A capacitance 29, which may include one or more capacitors, is connected in parallel with the inductor 28 with one side of the capacitance 29 and inductor 28 connected to ground 14 and the other side connected to the mixer 25 and detector 55. It should of course be understood that any local oscillator might be utilized and the oscillator 26 is illustrated for exemplary purposes only. Further, while a variable inductor is utilized in the local oscillator 26 it should be understood that the capacitance 29 might be varied instead.

The AC signal from the local oscillator 26 is supplied through a capacitor 70 to the base of a transistor 71. The emitter of the transistor 71 is grounded and the collector is connected through a resistor 72 to a DC bus line 73, which is connected to a terminal 74, having a suitable source of power connected thereto, through a resistor 75. The base of the transistor 71 is connected to the bus line 73 through a resistor 76. The transistor 71 and the associated circuitry forms a buffer amplifier for the signals from the oscillator 26 to provide the correct level of signals without overloading the oscillator 26.

The AC signal from the transistor 71 is coupled through a capacitor 80 to the base of a transistor 81, which in conjunction with a second transistor 82 and the associated circuitry forms a monostable circuit. The emitter of the transistor 81 is connected to ground and the collector is connected through a resistor 83 to the bus line 73. The bus line 73 is also connected through a capacitor 84 to ground 14 to provide additional filtering action. The collector of the transistor 81 is also connected to the cathode of a zener diode 85, the anode of which is connected to ground. In addition, the collector of the transistor 81 is connected, at point A, through a capacitor 86 to the base of the transistor 82, at point B, and through a resistor 87 to the cathode of Zener 85. The emitter of the transistor 82 is connected directly to ground and the collector is connected to the cathode of a diode 88, the anode of which is connected through a resistor 89 to the bus line 73. This monostable circuit is utilized to provide a substantially square DC pulse for each cycle of the AC input signal applied thereto. The amplitude of the pulses is fixed because the collector of the transistor 81 is connected to ground through the zener diode 85. The base of the transistor 82 is connected to the bus line 73 through a resistor 90 and the emitter to collector junction of a transistor 91.

The anode of the diode 88 is coupled through a resistor 95 to one side of a capacitor 96, the other side of which is grounded. The resistor 95 and capacitor 96 form an integrating circuit which converts the DC pulses available at the anode of the diode 88 into a DC signal. The junction of the resistor 95 and capacitor 96 is connected through a resistor 97 to the base of a transistor 98, which in conjunction with a second transistor 99 and the associated circuitry forms a differential amplifier. The emitters of the transistors 98 and 99 are connected together and through a resistor 100 to ground. The collector of the transistor 98 is connected through a parallel connected resistor 101 and capacitor 102 to the base of the transistor 98 and is connected through series connected resistors 103 and 104 to the bus line 73. The junction of the resistors 103 and 104 is connected to the base of the transistor 91 to feed back a small portion of the output voltage and increase pulse widths at the high end of the band, as is described below. The collector of the transistor 99 is connected through a capacitor 105 to the base of the transistor 99 and through a resistor 106 to the bus line 73. The base of the transistor 99 is connected to the adjustable arm of a potentiometer 107, one side of which is grounded and the other side of which is connected through a resistor 108 to the bus line 73. The bus line 73 is also connected through a zener diode 109 to ground to maintain the bus line at a fixed maximum amplitude. The potentiometer 107 serves to fix the amplitude at the low end of the frequency band and serves as a reference for the differential amplifier. A first terminal 110 is connected to the collector of the transistor 98 and a second terminal 111 is connected to the terminal of the transistor 99. The terminals 110 and 111 provide an output tuning voltage which varies between certain predetermined values, in this embodiment approximately 1.5 to 8 volts. It should be understood that a single output might be utilized, as illustrated in conjunction with the block diagram of FIG. 1 but two outputs are illustrated in FIG. 2 to describe another possible connection.

In the operation of the present circuitry, AC signals are supplied by the buffer amplifier to the monostable circuit, where each cycle of the AC signal is converted to a square DC pulse. The DC pulses from the monostable are integrated in the integrator circuit and the DC signal from the integrator circuit is amplified and compared to a predetermined fixed voltage in the differential amplifier circuit. A portion of the output of the differential amplifier circuit is supplied through a cathode follower to the monostable circuit to increase the width of the DC pulses at the high end of the frequency band.

This operation may be understood as follows. Just prior to the input signal at the base of the transistor 81 crossing from a negative value to a positive value the initial conditions are:

Transistor 82 is turned on via bias current from transistor 91; the emitter-base junction of transistor 82 clamps the B side of the capacitor 86 to about 0.7 volts; the voltage at the anode of the diode 88 is equal to the sum of the voltages of the collector of transistor 82 (0.1v) and the forward drop of the diode 88 (0.7v), thus the anode voltage, and therefore the monostable output to the integrator resistor 95, is about 0.8v; the voltage at the collector of transistor 81 is now determined by the tap of a voltage divider consisting of resistors 83 and 87 which is coupled between the bus line 73 voltage (9 volts) and the aforementioned second transistor 82 collector voltage of about 0.1 volts, this resulting in approximately 6 volts appearing at the collector of transistor 81 and thus at the A side of the capacitor 80. Thus, immediately prior to the turn on of transistor 81, point A is about 5.3 volts higher than point B.

When the input signal at the transistor 81 goes sufficiently positive to turn on this transistor its collector goes low thereby taking point A low. As the voltage across the capacitor 86 cannot change instantaneously point B will be taken to minus voltage thus turning off transistor 82. With transistor 82 off the voltage at the anode of the diode 88 will rise to about 6 volts as is determined by the center of the voltage divider, comprised of resistors 87 and 89, which is connected between the bus line 73 and the collector of transistor 81. The voltage at point B will now rise at a rate determined by capacitor 86 and resistor 90 toward the voltage at the emitter of transistor 91. When the rising voltage at point B is sufficient to turn transistor 82 back on, the voltage at the anode of the diode 88 will return to its prior value of about 0.8 volts. Should both transistor 81 and 82 be simultaneously off, as when transistor 81 has a negative half cycle at its input and the capacitor 86 has not yet charged to the turn on point of transistor 82, the Zener diode 85 will be biased to avalanche through resistor 87, the Zener diode 85, the diode 88, and the resistor 89 thereby maintaining the monostable's output voltage at approximately 6 volts until transistor 82 is biased into conduction. In this manner a fixed amplitude pulse is created at the output of the monostable.

The time required to charge point B to the turn on voltage of transistor 82 is dependent on the voltage at the emitter of transistor 91. An increased transistor 91 emitter voltage causes a shorter charge time and thus a narrower output pulse at the anode of the diode 88.

An increasing local oscillator 26 frequency causes the monostable to produce more output pulses per given time interval, the integrator thus creating a larger output DC voltage. This DC voltage is connected to the base of transistor 98 in the differential amplifier causing transistor 98 to conduct an increasing current. The increased transistor 98 current passes through resistor 104 thereby reducing the voltage on the base and the emitter of feedback transistor 91.

Thus an increase in oscillator 26 frequency causes the voltage at the emitter of transistor 91 to decrease and, from the previous analysis, will cause the width of the monostable's output pulse to increase. The DC signal from the differential amplifier is applied to the voltage variable capacitance diodes 37, 43 and 48 in the head end of the FM receiver of FIG. 1. Since the capacitance diodes 37, 43 and 48 require a nonlinear tuning voltage to present a linear dial display the increase in pulse width at the high end of the band by the signal fed back through the emitter follower circuit straightens the tuning response of the diodes to provide a substantially linear dial display.

Thus, an improved tuning system is disclosed wherein the frequency of the signal from the local oscillator of a receiver determines the amplitude of a DC signal. The DC signal is utilized to control the capacitance of voltage variable capacitance means, such as voltage variable capacitance diodes, which are incorporated in the head end of the receiver for tuning the receiver to a desired frequency. In general the local oscillator of an AM receiver will supply the AC signal for tuning the head end of an associated FM receiver, since the frequency of FM receivers is sufficiently high to make tuning with a voltage variable capacitance diode practical. The local oscillator can be tuned with any of the well known manually operable mechanical tuning devices, such as pushbuttons, search or automatic type tuning, etc.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A tuning system for a wave signal receiver including in combination:

manually tunable oscillator means providing an AC signal tunable through a range of frequencies;

frequency detector means connected to receive the AC signal from said oscillator means for converting the AC signal to a DC signal varying in amplitude in response to variations in the frequency of the AC signal produced by tuning said oscillator means;

said frequency detector means including a monostable circuit for converting the AC signal to DC pulses, an integrator circuit connected to receive the DC pulses and provide a DC signal, a differential amplifier including a pair of transistors having a reference voltage connected to one input thereof and said DC signal from said integrator circuit connected to the other input thereof and feedback circuit means connected between said differential amplifier means and said monostable circuit for increasing the DC pulse width from said monostable circuit in response to AC signals in the high end of the frequency band being connected thereto from said oscillator means;

variable capacitance means connected to the front end of the wave signal receiver for tuning the front end in response to a voltage applied to said variable capacitance means; and means connecting the DC signal from said differential amplifier means to said variable capacitance means for varying the tuning of the receiver front end in response to manual tuning of said local oscillator means.

2. An improved tuning system as claimed in claim 1 wherein the tuning system is incorporated in an AM and FM receiver and the local oscillator means includes an AM local oscillator.

3. The tuning system as claimed in claim 2 wherein the variable capacitance means connected to a receiver front end include voltage variable capacitance diodes connected in tuned circuits of radio frequency amplifier means, mixer means and local oscillator means of the FM portion of the receiver.

4. The tuning system as claimed in claim 1 wherein the monostable circuit includes a pair of transistors and the means feeding back a portion of the DC signal includes an emitter follower circuit in the base circuit of one of said pair of transistors.

* * * * *